(12) United States Patent
Smith et al.

(10) Patent No.: US 10,881,032 B1
(45) Date of Patent: Dec. 29, 2020

(54) COOLING UNIT FAN SPEED CONTROL

(71) Applicant: Equinix, Inc., Redwood City, CA (US)

(72) Inventors: David Lyle Smith, Hagerstown, MD (US); George E. Doblanko, Sunnyvale, CA (US)

(73) Assignee: EQUINIX, INC., Redwood City, CA (US)

( * ) Notice: Subject to any disclaimer, the term of this patent is extended or adjusted under 35 U.S.C. 154(b) by 742 days.

(21) Appl. No.: 15/454,894

(22) Filed: Mar. 9, 2017

(51) Int. Cl.
*H05K 7/20* (2006.01)
*G06F 1/3234* (2019.01)

(52) U.S. Cl.
CPC ....... *H05K 7/20836* (2013.01); *G06F 1/3234* (2013.01); *H05K 7/20736* (2013.01)

(58) Field of Classification Search
USPC .......................................................... 454/184
See application file for complete search history.

(56) References Cited

U.S. PATENT DOCUMENTS

| | | |
|---|---|---|
| 5,040,377 A | 8/1991 | Braun et al. |
| 7,890,215 B2 | 2/2011 | Duncan |
| 8,031,468 B2 * | 10/2011 | Bean, Jr. ............ H05K 7/20745 165/104.33 |
| 8,140,195 B2 | 3/2012 | Matteson et al. |
| 8,457,807 B2 | 6/2013 | Nastacio |
| 2015/0377509 A1 | 12/2015 | Nicolai et al. |
| 2016/0187397 A1 | 6/2016 | VanGilder |
| 2016/0234972 A1 | 8/2016 | Billet et al. |
| 2016/0239067 A1 | 8/2016 | Lovicott et al. |
| 2016/0291656 A1 * | 10/2016 | Jenne ....................... G06F 1/26 |

* cited by examiner

*Primary Examiner* — Vivek K Shirsat
(74) *Attorney, Agent, or Firm* — Shumaker & Sieffert, P.A.

(57) ABSTRACT

In general, techniques are described for overriding a programmed set-point of an air moving component of a cooling unit, in order to control an extent of a refrigeration load on an air cooling component of the cooling unit. In one example, an air cooling unit that is configured to be coupled to an electrical bus of a data center includes an air cooling component, an air moving component that is configured to supply air to the air cooling component at a volumetric flow rate according to a fan speed set-point of the air moving component, and a unit controller that is configured to adjust the fan speed set-point of the air moving component to limit power draw by the air cooling unit from the electrical bus to within a bounded range of values that is defined in part by a power draw set-point of the air cooling unit.

20 Claims, 8 Drawing Sheets

COOLING UNIT FAN SPEED CONTROL

TECHNICAL FIELD

The present disclosure relates to cooling systems.

BACKGROUND

A network services exchange provider or co-location provider ("provider") may operate a communication facility, such as a data center or warehouse, in which multiple customers of the provider locate various equipment such as network, server and storage gear, and interconnect with lengths of cable to a variety of telecommunications and other network service provider(s) often with a minimum of cost and complexity. Typically, it is the responsibility of the provider to implement a cooling solution to maintain environmental conditions within optimum ranges for operation of the equipment.

SUMMARY

In general, techniques are described for overriding a programmed set-point of an air moving component of a cooling unit, in order to control an extent of a refrigeration load on an air cooling component of the cooling unit. For example, a number of air cooling units deployed to a data center may be such that the cooling units could collectively, at any given time, overload or oversubscribe an electrical bus of the data center that is used to supply power to the cooling units. An active or dynamic power limiting sequence by a unit controller of the cooling unit may prevent electrical bus overload in such a scenario by overriding a set-point of the cooling unit, the set-point being set by a system controller for the data center to indicate a flow rate for an air moving component of the cooling unit. The unit controller of the cooling unit may override the set-point to reduce the actual flow rate for the cooling unit below the indicated flow rate and maintain the total cooling unit power consumption within an acceptable range. As a result, the techniques may improve data center reliability and/or efficiency for providing robust temperature and humidity control by reducing overloading or oversubscription while allowing for redundant cooling units on a shared electrical bus.

In one example, an air cooling unit that is configured to be coupled to an electrical bus, comprises: an air cooling component; an air moving component that is configured to supply air to the air cooling component at a volumetric flow rate according to a fan speed set-point of the air moving component; and a unit controller that is configured to adjust the fan speed set-point of the air moving component to limit power draw by the air cooling unit from the electrical bus to within a bounded range of values that is defined in part by a power draw set-point of the air cooling unit.

In another example, a method comprises: by an air cooling unit that includes an air moving component and an air cooling component and that is coupled to an electrical bus, limiting power draw from the electrical bus by the air cooling unit to within a bounded range of values by controlling a fan speed set-point of the air moving component, which is configured to supply air to the air cooling component at a volumetric flow rate that is defined by the fan speed set-point.

In another example, a system comprises: at least one air cooling unit that is coupled to an electrical bus of a data center and that comprises an air cooling component and an air moving component that is configured to supply air to the air cooling component at a volumetric flow rate that is defined by a fan speed set-point of the air moving component; and a system controller that is configured to manage operational status of the at least air one cooling unit; wherein the at least air one cooling unit is configured to adjust the fan speed set-point of the air moving component to limit power draw from the electrical bus by the at least one air cooling unit to within a bounded range of values that is defined by a power draw set-point determined by the system controller.

DETAILED DESCRIPTION

Figure 1:
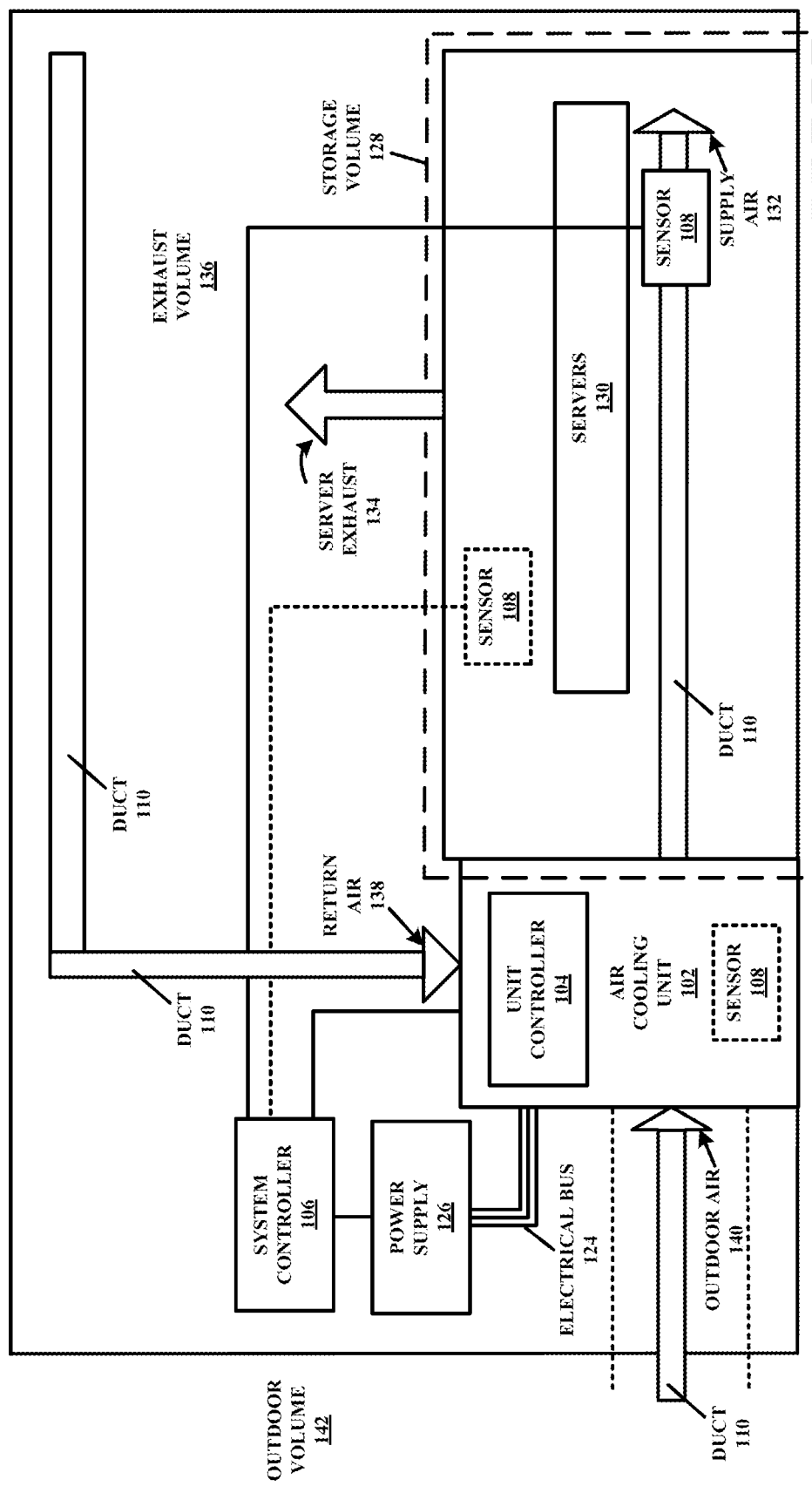
FIG. 1 shows an example layout of a data center that includes an air cooling unit incorporated within a data center cooling system according to the disclosure.

FIG. 1 shows an example layout of a data center 100 that includes an air cooling unit 102 incorporated within a data center cooling system according to the disclosure. In particular, and as discussed in detail below, a unit controller 104 of air cooling unit 102 is configured to override a fan speed set-point that is programmed to air cooling unit 102 by a system controller 106 based in part upon an air pressure and/or temperature reading taken by a sensor 108 positioned within a duct 110, for example, of data center 100. By doing so, unit controller 104 may limit power draw by air cooling unit 102 from an electric bus 124, that in turn may be coupled to a common power supply 126 for multiple instances of air cooling unit 102, to within a bounded range of values that is defined in part by a power draw set-point of air cooling unit 102. In an example, the power draw set-point is programmed to air cooling unit 102 by system controller 106 based upon a number of instances of air cooling unit 102 that is/are coupled to electrical bus 124 to at all times prevent electric bus 124 from overload or oversubscription.

Data center 100 further includes storage volume 128 that stores servers 130. In operation, air cooling unit 102 cools and supplies supply air 132 to storage volume 128, and server exhaust 134 is released from servers 130. Warm air, including server exhaust 134, in exhaust volume 136 is returned as return air 138 to be cooled and recirculated by air cooling unit 102. Data center 100 may be a facility for storing one or more electronic devices such as servers 130, network and storage gear, as well as power distribution units (PDUs), or any other suitable electronic or supporting devices according to particular needs. Data center 100 may be situated in a stand-alone building used primarily or exclusively for data center 100, or may be situated in a portion of a larger building used for other uses including office space, residential space, retail space or any other suitable use.

Data center 100 may be in an urban, suburban, or rural location or any other suitable location with any suitable climate. Data center 100 may provide an operating environment for co-location, interconnection, and/or other services. For example, data center 100 may provide an operating environment for any number of services that may be categorized according to service types, which may include, for example, applications/software, platforms, infrastructure, virtualization, and servers and data storage. The names of service types are often prepended to the phrase "as-a-Service" such that the delivery of applications/software and infrastructure, as examples, may be referred to as Software-as-a-Service (SaaS) and Infrastructure-as-a-Service (IaaS), respectively.

As mentioned, storage volume 128 of data center 100 may be used to store servers 130. In addition, storage volume 128 may store network and/storage gear or any other suitable electronic or supporting devices. Because servers 130 typically operate more efficiently and/or reliably within a temperature range exceeded by the temperature of heat exhaust produced by servers 130 and/or other devices stored in storage volume 128, it may be desirable to keep air in storage volume 128 within the temperature range. Storage volume 128 may include one or more racks, cabinets, cages, or other storage devices housing servers 130 and/or any other computing equipment. Storage devices for servers 130 may be arranged in rows within storage volume 128. Rows may be positioned between "cold aisles" for supplying cool supply air 132 to servers 130 and "hot aisles" for collecting server exhaust 134 and diverting server exhaust 134 to exhaust volume 136. In the view or perspective of FIG. 1, servers 130 are located behind a cold aisle for supplying cool supply air 132 and servers 130 are located in front of a hot aisle for collecting and diverting server exhaust 134 to exhaust volume 136.

Servers 130 may be systems that respond to requests across a computer network to provide, or help to provide, a network or data service. Each one of servers 130 may include one or more processors that execute software that is capable of accepting requests from clients. Requests from clients may be to share data, information, or hardware and software resources. Servers 130 may include one or more of a database server, file server, mail server, print server, web server, gaming server, application server, communication server, compute server, media server, or any other suitable type of server that may be employed by a data center provider or tenant of the data center provider, according to particular needs. Servers 130 may be specialized or general-purpose devices. Servers 130 may represent x86 or other real or general-purpose server computing or computer devices configured to apply and/or offer services to customers. Servers 130 may also include special-purpose appliances or controllers for providing interconnection services between customers of a co-location facility provided by data center 100 or for providing any other suitable services according to particular needs. Servers 130 may use any suitable operating system including Unix-like open source distributions, such as those based on Linux and FreeBSD, Windows Server, or any other suitable operating system.

Server exhaust 134 may be warm air heated by servers 130. As electricity passes across circuits and through wires within servers 130, it may meet a natural degree of resistance. This resistance creates heat. Vents in a chassis of servers 130 and/or server cabinets may allow for the escape of heat from servers 130 resulting in warm server exhaust 134. Vents may be strategically placed to release heat and, therefore, server exhaust 134 in the hot aisles described above and to allow for server exhaust 134 to enter exhaust volume 136 for return to air cooling unit 102 for cooling and recirculation. Alternatively, or in addition, server exhaust 134 may be diverted outside data center 100 through exhaust fans or relief vents in the data center 100 and/or in the air cooling unit 102, or to any other suitable location instead of being cooled and recirculated. The amount of heat generated by servers 130, and therefore the amount of server exhaust 134 generated by servers 130, may vary depending on the number, composition, and functions of servers 130. For example, different functions performed by different components within servers 130 may result in different amounts of heat generation.

Supply air 132 may be air that is supplied to storage volume 128 to keep air within storage volume 128 and surrounding servers 130 relatively cool, such that servers 130 may be maintained at a temperature within a preferred operating temperature range for the servers 130. Although described throughout as "air," supply air 132 may be any suitable composition of gas for cooling devices within storage volume 128. Supply air 132 may be supplied by cooling return air 138 or any other suitable air source in air cooling unit 102 or by drawing air from a source of air that is already cool such as, for example, outdoor air 140 from outdoor volume 142 in a location with a cool climate. For example, for data center 100 in New York in the winter, supply air 132 may be supplied by drawing outdoor air 140 in from outdoor volume 142, outside data center 100.

Air cooling unit 102 may be a unit for cooling and circulating cool supply air 132 in storage volume 128. Any number of cooling units 102 may be used to provide cool supply air 132 to storage volume 128, discussed further below in connection with FIG. 2. In certain examples, air cooling unit 102 may cool air from return air 138 and recirculate it as cool supply air 132 in storage volume 128. In some cases, air cooling unit 102 may draw air from another source, such as outdoor air 140 from air outside data center 100, in outdoor volume 142, to supply as cool supply air 132 in storage volume 128. For example, in certain locations where the climate is relatively cool during at least part of the year, air cooling unit 102 may draw outdoor air 140 from outdoor volume 142, outside data center 100, during those parts of the year and may supply that air as cool supply air 132 into storage volume 128. Air cooling unit 102 may do this in addition to, or alternatively to, cooling return air 138 to supply as cool supply air 132. For example, cool supply air 132 may be supplied partly from cooling return air 138 and partly from outdoor air 140 drawn from outdoor volume 142 when outdoor volume 142 has a cool temperature. Air cooling unit 102 may alternate from drawing outdoor air 140 from outdoor volume 142 during times of cool outdoor volume 142 temperatures to cooling return air 138 during times of warm outdoor volume 142 temperatures.

Alternatively or in addition, air cooling unit 102 may, at the same time, use a combination of return air 138 and outdoor air 140 from outdoor volume 142 to supply cool supply air 132 to storage volume 128. Drawing at least a portion of supply air 132 from outdoor volume 142 as outdoor air 140 may increase efficiency by limiting the energy needed to cool sufficient return air 138 to supply cool supply air 132 to storage volume 128. Alternatively or in addition, air cooling unit 102 may cool air from a different source than return air 138. For example, air cooling unit 102 may draw and cool outdoor air 140 from outdoor volume 142 that may be cooler than return air 138 but not cool enough to supply as cool supply air 132 without cooling by air cooling unit 102. Air cooling unit 102 may cool air using a refrigeration cycle, evaporation, free cooling, based on desiccants, or in any other suitable manner.

Duct 110 may be a portion of a duct system located above or otherwise proximate to servers 130 and defining exhaust volume 136 to collect server exhaust 134 and return it as return air 138 to the air cooling unit 102. Duct 110 may be composed of galvanized steel, aluminum, Polyurethane and phenolic insulation panels, fiberglass duct board, flexible plastic, metal wire coil, aluminum/zinc alloy, multilayer laminate, fiber reinforced polymer, or any other suitable material or combination of materials.

Sensor 108 may include one or more sensors configured to measure any suitable parameter(s) of data center 100. In some examples, sensors 108 may include one or more sensors for measuring pressure, temperature and/or a humidity level (e.g., relative humidity, dew point, or wet bulb temperature) of supply air 132, return air 138 and/or storage volume 128 and may be located, for example, within storage volume 128 and/or within air cooling unit 102. In some examples, one or more instances of sensor 108 may be positioned within duct 110 and used to measure at least one of air pressure and temperature at any particular location within duct 110, equivalently at any particular location within data center 100. As discussed in further detail below, air pressure and/or temperature measurements at a particular location within duct 110 may be used by system controller 106 to determine a fan speed set-point for air cooling unit 102 such that air cooling unit 102 may output supply air at a particular volumetric flow rate (e.g., cubic feet per minute) in order to meet a cooling demand for storage volume 128 at a particular instant in time, where the cooling demand for storage volume is in general dynamic or changes in time.

Additionally, or alternatively, air pressure or temperature at a particular location within storage volume 128 may be used by system controller 106 to determine a fan speed set-point for air cooling unit 102 such that air cooling unit 102 may output supply air at a particular volumetric flow rate in order to meet a cooling demand for storage volume 128 at a particular instant in time, where the cooling demand for storage volume is in general dynamic or changes in time. For example, one or more instances of sensor 108 may be positioned in one or more hot aisles and/or in one or more cold aisles, whereby air pressure and/or temperature at a particular location(s) within a particular hot aisle(s), air pressure and/or temperature at a particular location(s) within a particular cold aisle(s), or a pressure and/or temperature differential between or across a particular hot aisle(s) and a particular cold aisle(s) may be used by system controller 106 to determine a fan speed set-point for air cooling unit 102. Thus, a fan speed or fan speed set-point of air cooling unit 102 may be controlled based upon an air pressure and/or temperature reading taken within any particular space of data center 100, including differential temperatures between hot and cold aisles with data center 100 or between return air 138 and supply air 132.

Exhaust volume 136 may be a volume within data center 100 for collecting and returning warm air to the cooling system for cooling and recirculation. For example, server exhaust 134 may be collected in exhaust volume 136. Exhaust volume 136 may be a volume within a duct system including a volume within a plenum for collecting server exhaust 134, power distribution unit (PDU) exhaust, and any other suitable warm air, according to particular needs, and returning it to air cooling unit 102 as return air 138, releasing it outside data center 100, or otherwise diverting it in any other suitable manner according to particular needs. All or a portion of exhaust volume 136, including a plenum in exhaust volume 136, may be depressurized to help divert server exhaust 134 into exhaust volume 136 and return it as return air 138 to air cooling unit 102 according to particular needs.

Return air 138 may be a stream of air returned to air cooling unit 102 for cooling and recirculation. For example, server exhaust 134, as described above, may be collected in exhaust volume 136 and returned to air cooling unit 102 as return air 138. Once returned to air cooling unit 102, warm return air 138 may be cooled and recirculated in storage volume 128 as cool supply air 132 by air cooling unit 102. Return air 138 may be steered to air cooling unit 102 by controlling pressure within all or a portion of exhaust volume 136 or by any other suitable manner according to particular needs.

Figure 2:
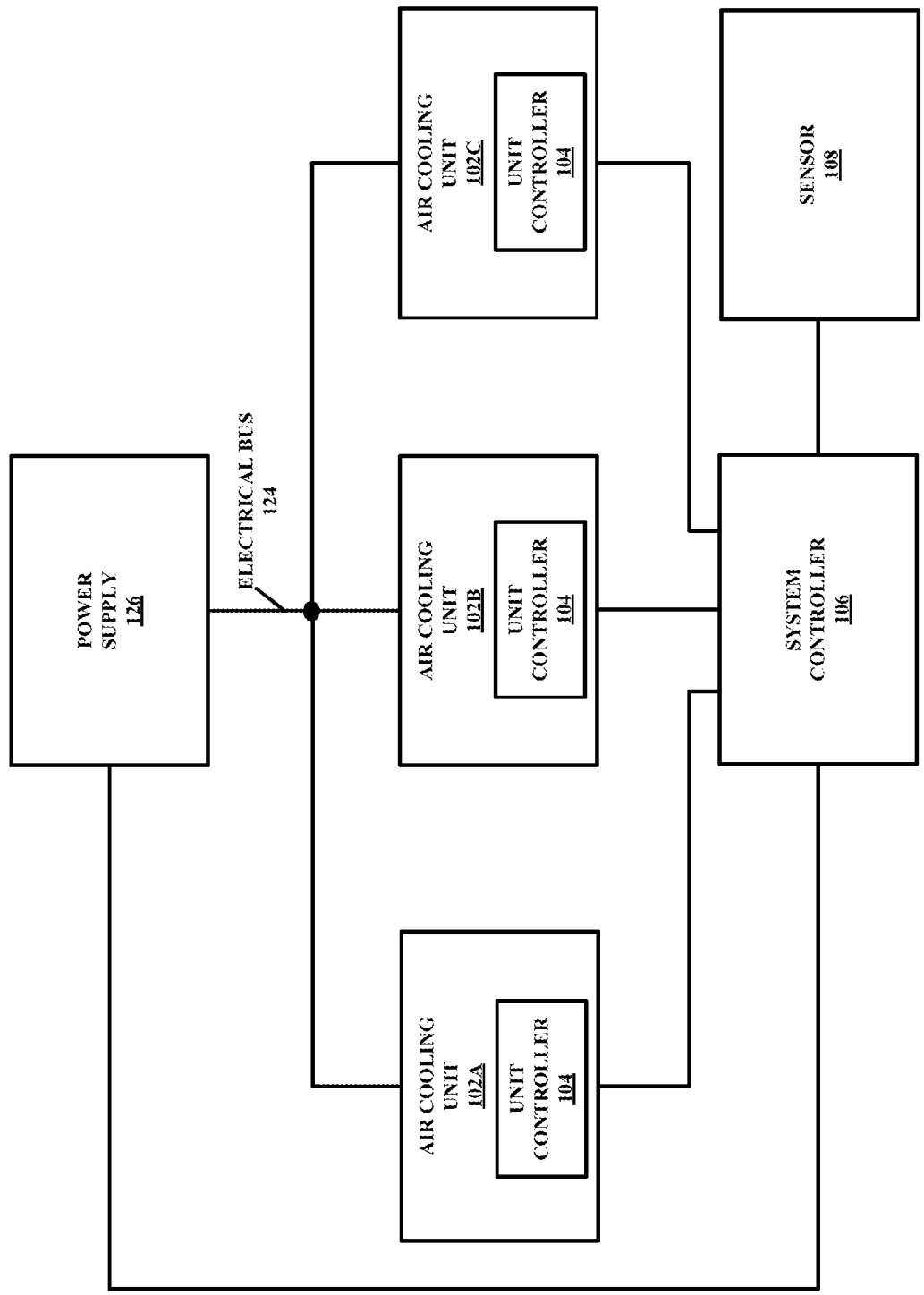
FIG. 2 shows the data center of FIG. 1 in first alternate detail.

As mentioned above, unit controller 104 of air cooling unit 102 is configured to override a fan speed set-point that is programmed to air cooling unit 102 by system controller 106 based upon an air pressure and/or temperature reading taken by sensor(s) 108 positioned within data center 100. By doing so, unit controller 104 may limit power draw by air cooling unit 102 from electric bus 124 to within a bounded range of values that is defined by a power draw set-point of air cooling unit 102. In one example, the power draw set-point is programmed to air cooling unit 102 by system controller 106 based upon a number of instances of air cooling unit 102 that is/are coupled to electrical bus 124, and ultimately power supply 126, to at all times prevent electric bus 124 from overload or oversubscription. FIG. 2, which shows data center 100 of FIG. 1 in first alternate detail, is illustrative of such an example implementation.

More specifically, and with continued reference to FIG. 1, FIG. 2 shows a number of instances (three, for example purposes only, air cooling unit 102A-C) of air cooling unit 102 each coupled to power supply 126 by electrical bus 124. In general, electrical bus 124 has a particular architecture or topology and a capacity that, among other things, is defined by material composition and cross-sectional size or area, which in turn may be selected based upon implementation-specific details and/or monetary concerns, and that may be expressed in any particular unit of measure as desired. As an example, electrical bus 124 may exhibit a capacity of 500 kW that if exceeded for a particular time period may lead to damage and ultimately failure of electrical bus 124, power supply 126, and/or other systems or components coupled to electrical bus 124.

However, due to concerns related to operational phasing, redundancy and serviceability, as well as other provider concerns associated with operating data center 100, the number of instances of air cooling unit 102 coupled to electrical bus 124 may be such that the same could collectively, at any given time, overload or oversubscribe electrical bus 124. For example, air cooling units 102A-C may each be factory configured to be capable of drawing a maximum of 200 kW under full load. Thus, if permitted to draw the maximum of 200 kW from electrical bus 124 at a same instant in time, the capacity of electrical bus 124 would be exceeded to overload or oversubscribe electrical bus 124. This is because 600 kW (3×200 kW) is greater than the example 500 kW capacity of electrical bus 124. A power limiting sequence according to techniques described herein may prevent such an occurrence.

For example, to prevent such an occurrence, system controller 106 may program a power draw set-point or limit to each one of air cooling units 102A-C based upon the number of instances of air cooling unit 102 that is/are coupled to electrical bus 124. For example, system controller 106 may program a power draw set-point of 165 kW to each one of air cooling unit 102A-C. In this example, and when enforced by unit controller 104, if each one of air cooling units 102A-C was permitted to draw the maximum of 165 kW from electrical bus 124 at a same instant in time, then capacity of electrical bus 124 would not be exceeded to overload or oversubscribe electrical bus 124. This is because 495 kW (3×165 kW) is less than the example 500 kW capacity of electrical bus 124. Other examples are possible.

Figure 3:
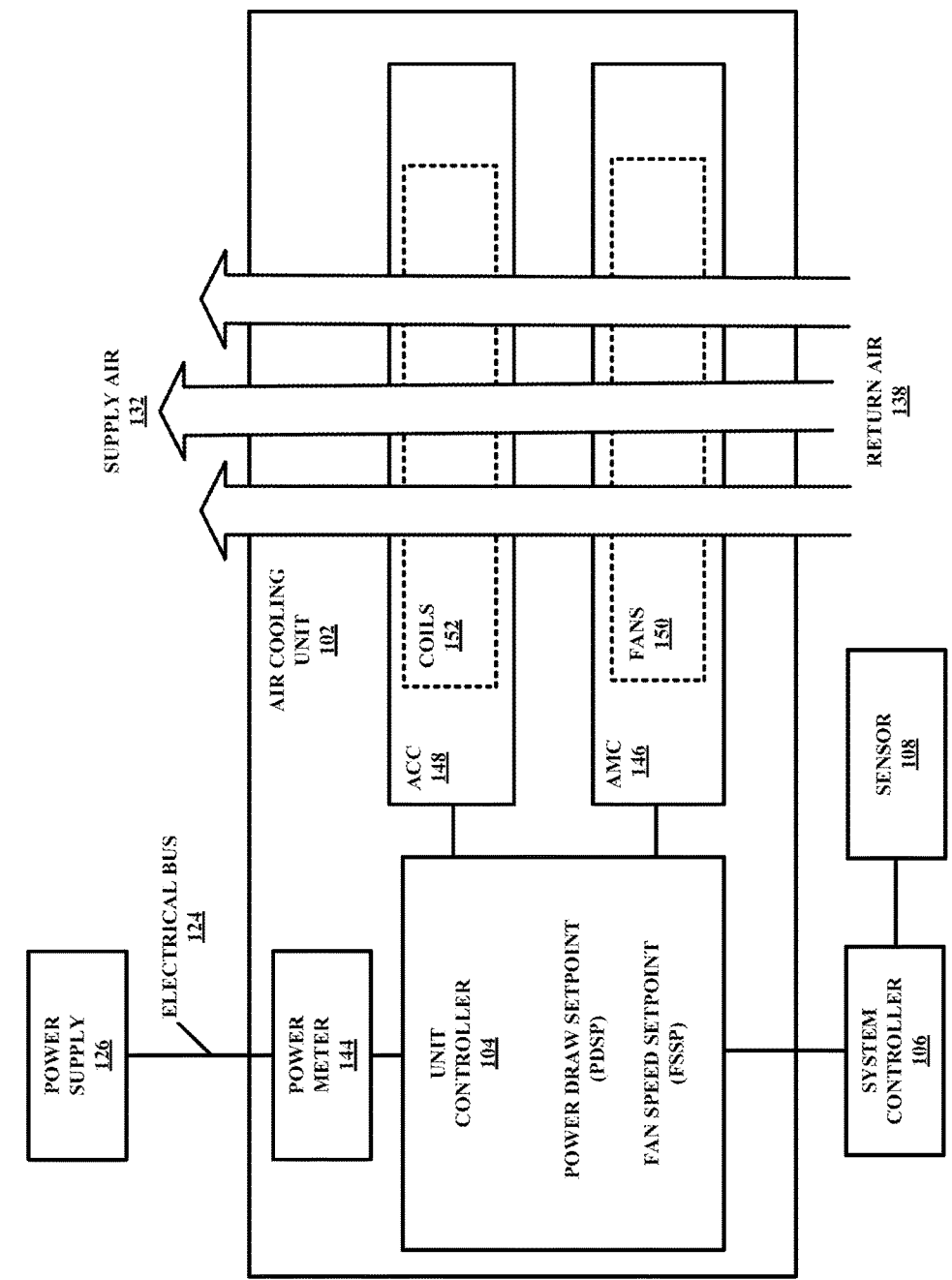
FIG. 3 shows the data center of FIG. 1 in second alternate detail.

Unit controller 104 may meter or monitor power draw of air cooling unit 102 from electrical bus 134, and limit power draw by air cooling unit 102 from electric bus 124 to at least a value less than the power draw set-point, by overriding a fan speed set-point that is programmed to air cooling unit 102 by system controller 106 based upon an air pressure and/or temperature reading taken by sensor 108 positioned within duct 110 of data center 100. FIG. 3, which shows data center 100 of FIG. 1 in second alternate detail, is illustrative of such an implementation.

More specifically, and with continued reference to FIGS. 1-2, FIG. 3 shows unit controller 104 coupled to a power meter 144, as well as to an air moving component (AMC) 146 and an air cooling component (ACC) 148, that is integral to or within air cooling unit 102. In this example, unit controller 104 is configured to control a fan speed (e.g., revolutions per minute) of one or more rotary fans 150 of AMC 146 according to a fan speed set-point (e.g., integer value "x" revolutions per minute). By extension, unit controller 104 is configured to control the volumetric flow rate of return air 138 that is passed to and over or through one or more cooling coils 152 of ACC 148, where coil(s) 152 may employ refrigeration cycle, chilled water, evaporation, free cooling, be based on desiccants, in any other manner of cooling supply air 132, and where cooled return air 138 is output from air cooling unit 102 as supply air 132. Although the present disclosure is not so limited, in one example, the fan speed set-point (FSSP) is programmed to unit controller 104, for unit controller 104 to enforce, by system controller 106 based upon an air pressure and/or temperature reading taken by sensor 108 positioned within duct 110 of data center 100.

Figure 4:
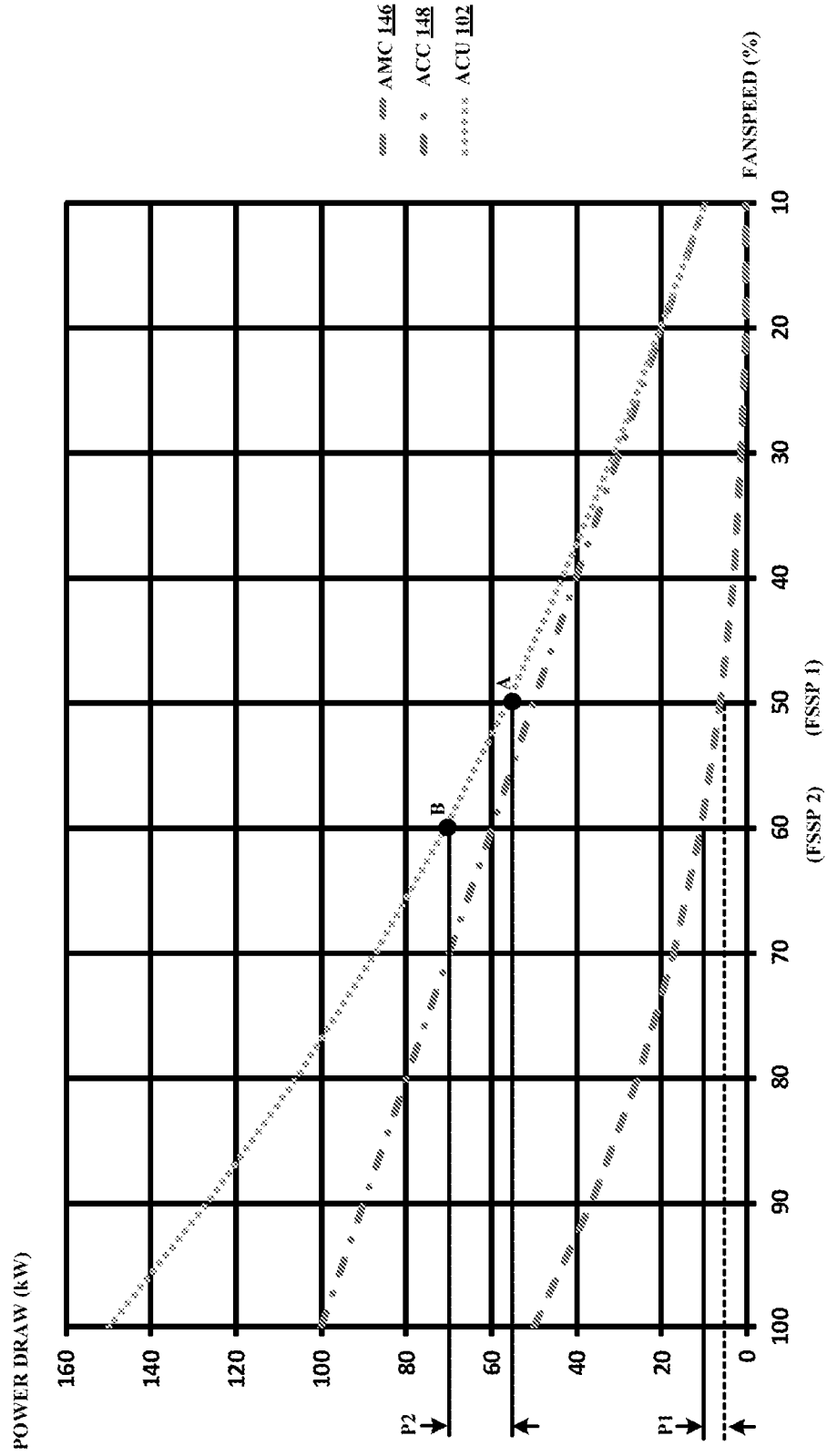
FIG. 4 shows a first plot of power draw by the air cooling unit of FIG. 1.

Unit controller 104 is further configured to read from power meter 144 overall power draw by air cooling unit 102 (e.g., 166 kW, instantaneous) from electrical bus 124 and, based on an instant reading, limit or adjust power draw by air cooling unit 102 from electrical bus 124 to a value that is at least less than a power draw set-point (PDSP) that is programmed to unit controller 104. To do so, unit controller 104 is configured to adjust the fan speed (set-point) to decrease or increase the volumetric flow rate of return air 138 that is passed to and over or through one or more cooling coils 152 of ACC 148. This has the effect of changing the refrigeration load on ACC 148, which in turn has the effect of changing the overall power draw by air cooling unit 102 from electrical bus 124 because overall power consumption of air cooling unit 102 (equivalently, overall power draw by air cooling unit 102 from electrical bus 124) is proportional to the overall power consumption of ACC 148, which in turn is proportional to the refrigeration load on ACC 148. FIG. 4, which shows a first plot 400 of power draw by air cooling unit (ACU) 102 of FIG. 1, is illustrative of the relationship between overall power consumption of air cooling unit 102 and overall power consumption of ACC 148.

More specifically, first plot 400 is a plot that illustrates power consumption of AMC 146, power consumption of ACC 148 and overall power of consumption air cooling unit 102 (equivalently, overall power draw by air cooling unit 102 from electrical bus 124 during operation) as a function of fan speed of one or more rotary fans 150 of AMC 146. The data of first plot 400 is organized in TABLE 1, below, and serves as an example only.

TABLE 1

| Fan Speed (%) | AMC 146 Power Consumption (kW) | ACC 148 Power Consumption (kW) | ACU 102 Power Consumption (kW) |
| --- | --- | --- | --- |
| 100 | 50 | 100 | 150 |
| 90 | 36.45 | 90 | 126.45 |
| 80 | 25.6 | 80 | 105.6 |
| 70 | 17.15 | 70 | 87.15 |
| 60 | 10.8 | 60 | 70.8 |
| 50 | 6.25 | 50 | 56.25 |
| 40 | 3.2 | 40 | 43.2 |
| 30 | 1.35 | 30 | 31.35 |
| 20 | 0.4 | 20 | 20.4 |
| 10 | 0.05 | 10 | 10.05 |

In practice, the power consumption of AMC 146 varies as the cube ($\sim x^3$) with respect to fan speed (%) of rotary fan(s) 150 of AMC 146, whereas the power consumption of ACC 148, which is proportional to the refrigeration load on ACC 148, varies linearly with respect to fan speed (%) of rotary fan(s) 150 of AMC 146. Thus, in first plot 400, the trace for the power consumption of ACU 102 has a form similar to the trace for the power consumption of AMC 146 but offset due to the contribution of the power consumption of ACC 148. Because power consumption of AMC 146 exhibits power law behavior ($\sim x^3$), relatively little energy is required to induce, via fan speed adjustment, a relatively large change in overall power draw air of cooling unit 102 from electric bus 124. For example, the increase in power consumption of AMC 146 as required to change (override) the fan speed set-point from FSSP [1] to FSSP [2], represented by parameter P1 in FIG. 4, in order to change the overall power draw air cooling unit 102 from operating point A to operating point B, is relatively insignificant when compared to the increase in power consumption of ACC 148, represented by parameter P2 in FIG. 4.

Figure 5:
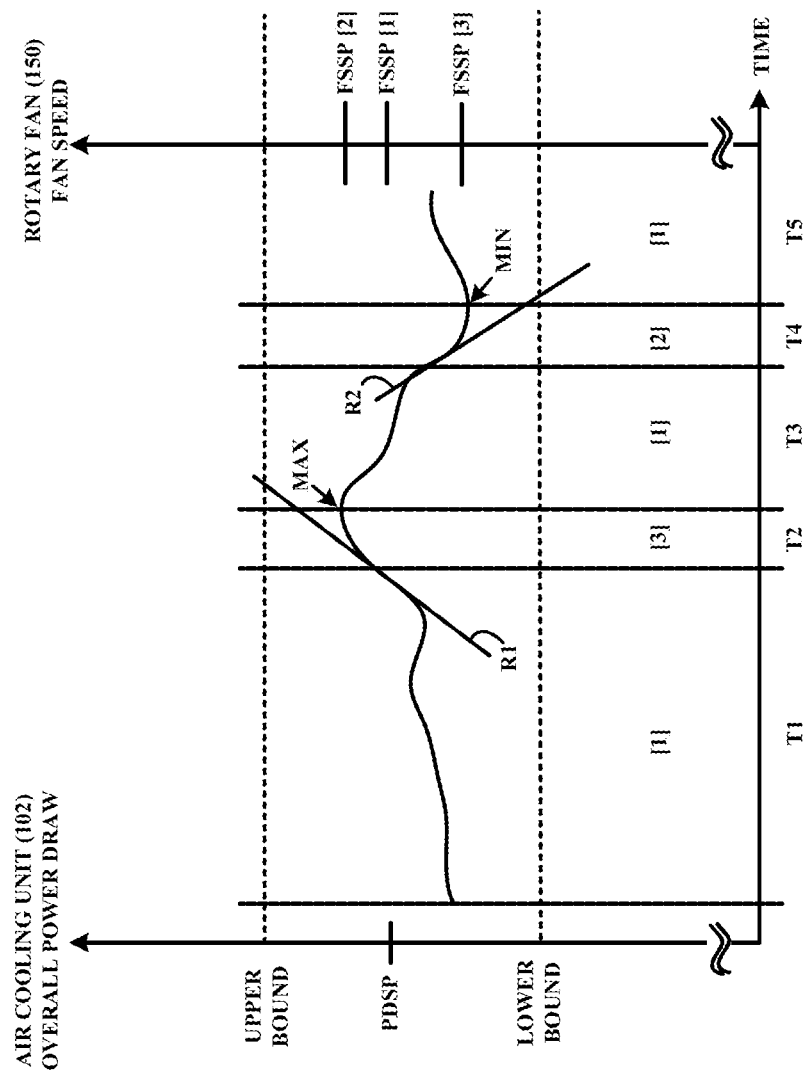
FIG. 5 shows a second plot of power draw by the air cooling unit of FIG. 1.

Additionally, fan speed (set-point) of rotary fans 150 of AMC 146 may be precisely adjusted in a time-controlled manner, which is not the case if one or more compressors of ACC 148 was/were cycled on/OFF for example in order to change the operating point of air cooling unit 102. By extension, overall power draw by air cooling unit 102 from electrical bus 124 may be precisely adjusted in a time-controlled manner via adjustment of fan speed of rotary fans 150, because as mentioned above fan speed (set-point) may be adjusted to decrease or increase the volumetric flow rate of return air 138 that is passed to and over or through one or more cooling coils 152 of ACC 148 to change the refrigeration load on ACC 148. FIG. 5, which shows a second plot 500 of power draw by air cooling unit 102 of FIG. 1, is illustrative of an example algorithm to control overall power draw air of cooling unit 102 from electric bus 124 via adjustment of fan speed (set-point).

More specifically, and with continued reference to FIGS. 1-4, second plot 500 is a multi-dimensional plot that illustrates overall power consumption of air cooling unit 102 (equivalently power draw by air cooling unit 102 from electrical bus 124 during operation) as a function of time, as well as fan speed of one or more rotary fans 150 of AMC 146 along a one-dimensional axis. In this example, unit controller 104 is configured to read from power meter 144 overall power draw by air cooling unit 102 from electrical bus 124 and, based on an instant reading, limit power draw by air cooling unit 102 from electrical bus 124 to within a range of values, between upper and lower bound, that is defined in part by a power draw set-point PDSP of air cooling unit 102. In general, the difference between PDSP and upper bound, as well as the difference between PDSP and lower bound, is programmable and, as mentioned above, system controller 106 may program PDSP to air cooling unit 102 based upon the number of instances of air cooling unit 102 that is/are coupled to electrical bus 124. The difference between PDSP and upper bound and the difference between PDSP and lower bound may be equal.

In the example of FIG. 5, overall power draw by air cooling unit 102 from electrical bus 124 fluctuates between upper and lower bound around operating point A in time, which corresponds to fan speed FSSP [1] that in turn is correlated with PDSP. At onset of time period T2, unit controller 104 detects that overall power draw by air cooling unit 102 is increasing at a rate R1 towards upper bound and, in response, adjusts the fan speed set-point from FSSP [1] to FSSP [3] in order to throttle back refrigeration load on ACC 148, reduce overall power draw by air cooling unit 102 and ultimately prevent overall power draw by air cooling unit 102 from exceeding upper bound. At onset of time period T3, unit controller 104 detects a local maximum MAX, or an inflection point, and in response, slowly adjusts the fan speed set-point from FSSP [3] back to FSSP [1] in order to maintain power draw by air cooling unit 102 around PDSP. In this example, the rate by which the fan speed set-point is "slowly" adjusted back from FSSP [3] back to FSSP [1] may in general be a function of R1, which is programmable. For example, if R1A>>R1B (where "A" and "B" designate different values for R1) then rate (R1A)>>rate (R1B), in order to maintain power draw by air cooling unit 102 within a range of the upper bound and lower bound, defined in part by the PDSP.

Figure 6:
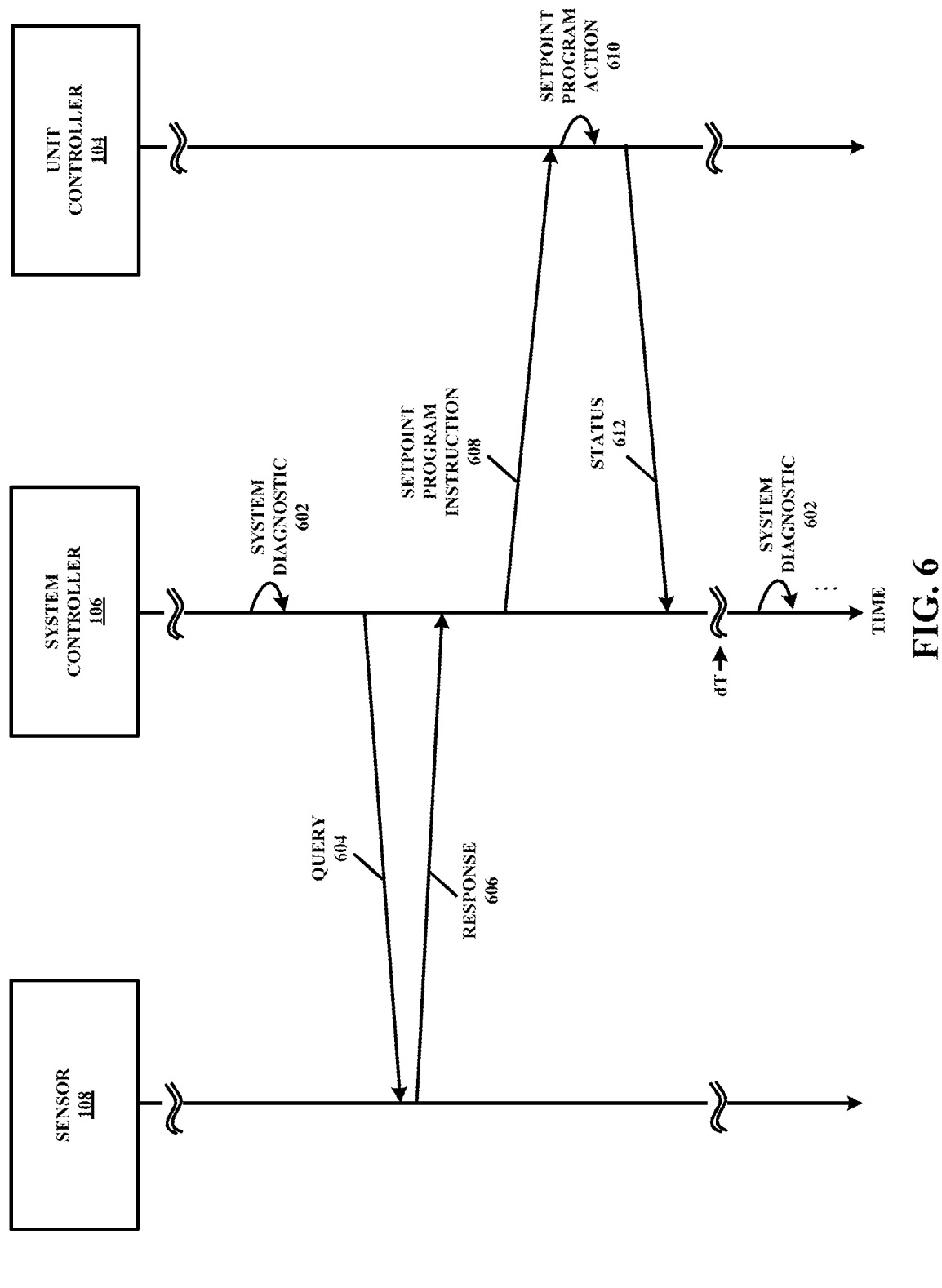
FIG. 6 shows an example communication sequence according to the disclosure.

At onset of time period T4, unit controller 104 detects that overall power draw by air cooling unit 102 is decreasing at a rate R2 towards lower bound and, in response, adjusts the fan speed set-point from FSSP [1] to FSSP [2] in order to throttle up refrigeration load on ACC 148, increase overall power draw by air cooling unit 102 and ultimately prevent overall power draw by air cooling unit 102 from passing lower bound. At onset of time period T5, unit controller 104 detects a local minimum MIN, or an inflection point, and in response, slowly adjusts the fan speed set-point from FSSP [2] back to FSSP [1] in order to maintain power draw by air cooling unit 102 around PDSP. In general, each one of FSSP [1], FSSP [2] and FSSP [3], as well as R1, R2, MAX and MIN is a programmable value, that which may be defined as desired, possibly on an implementation-specific basis, and throughout time. Accordingly, it is contemplated that system controller 106 may periodically or at least intermittently program unit controller 104 to implement the various features or aspects of the present disclosure. FIG. 6, which shows an example communication sequence 600 according to the disclosure is illustrative.

More specifically, and with continued reference to FIGS. 1-5, communication sequence 600 illustrates example actions or responses by each one of sensor 108, system controller 106 and unit controller 104 based upon a system diagnostic (602) instantiated by system controller 106, periodically or at least intermittently, in response to a programmed routine or manually input command. In this example, system controller 106 may transmit (604) a query to sensor 108 to obtain an air pressure and/or temperature reading within data center 100 (see FIG. 1). In reply, sensor 108 may transmit (606) a response to system controller 106 to provide an air pressure reading within duct 110, for example, of data center 100 to system controller 106. Based upon the air pressure reading, system controller 106 may transmit (608) a set-point program instruction that includes a power draw set-point to unit controller 104. In general, if power draw by air cooling unit 102 exceeds PDSP (plus a deadband in some examples), then unit controller 104 may slowly decrease FSSP to reduce power draw by air cooling unit 102. Conversely, if power draw by air cooling unit 102 exceeds PDSP (minus a deadband in some examples) then unit controller 104 may slowly increase FSSP to increase power draw by air cooling unit 102.

In some examples, the set-point program instruction may further include a user-adjustable parameter that represents a minimum volumetric flow rate for AMC 146, so that unit controller 104 may control fan speed of fan(s) 150 such that volumetric flow rate of air provided to coils 152 of ACC 148 does not reach a value less than the minimum volumetric flow rate. This may insure that air cooling unit 102 while online is constantly maintained to a standby ready status to provide cooling capacity for data center 100. In response, unit controller 104 may program (610) itself to enforce the minimum volumetric flow rate for AMC 146 as well as limit or adjust power draw by air cooling unit 102 from electrical bus 124 to a value that is at least less than the power draw set-point in a manner as discussed throughout this disclosure.

Figure 7:
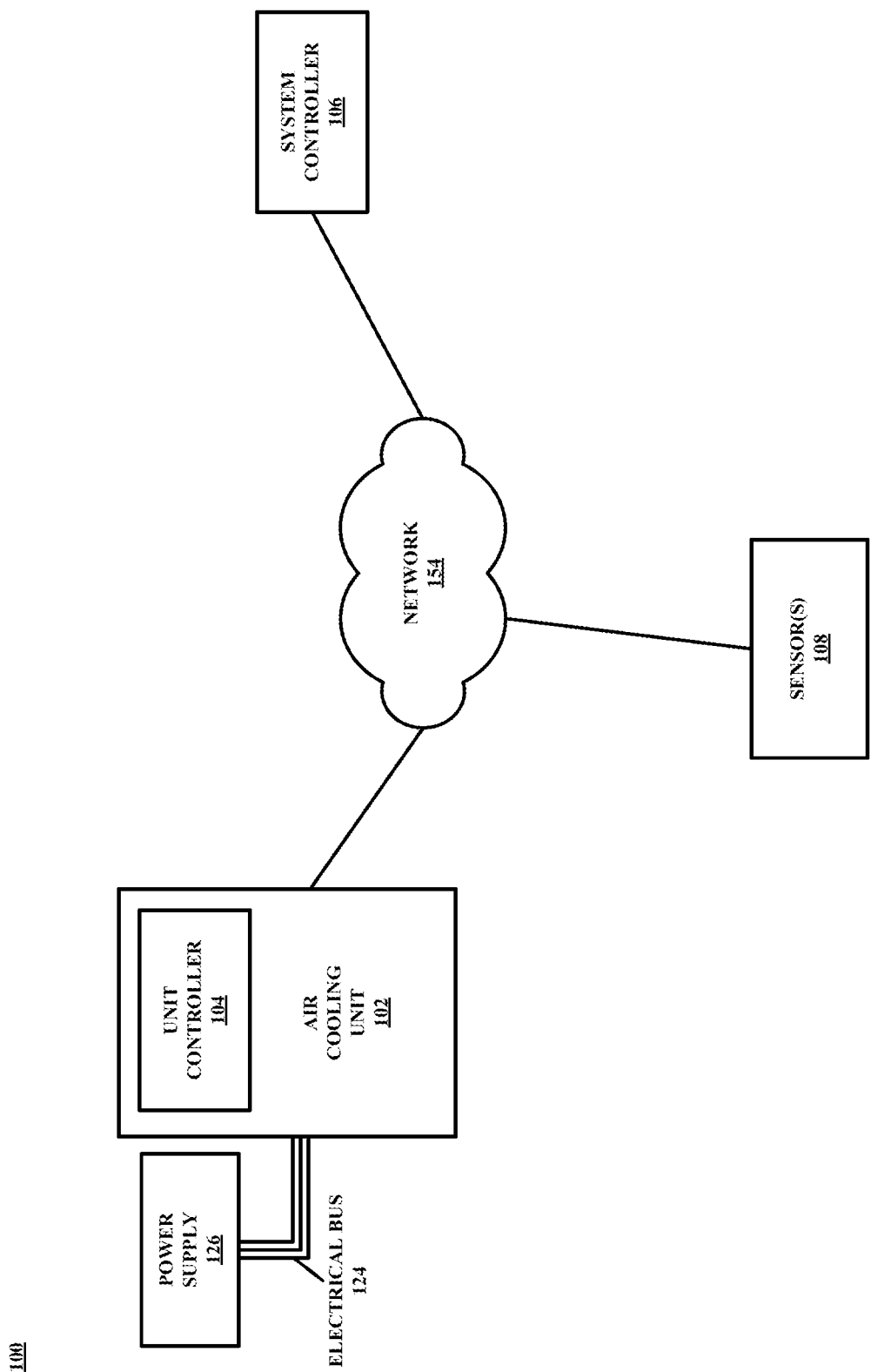
FIG. 7 shows the data center of FIG. 1 in second alternate detail.

Additionally, unit controller 104 may transmit (612) to system controller 106 a status to report to system controller 106 current operational status of unit controller 104. It is contemplated that operational status may include any relevant parameter such as, for example, previous and/or current fan speed (FSSP) of fan(s) 150. In practice, communication between each one of sensor 108, system controller 106 and unit controller 104 may occur over a network. FIG. 7, which shows data center 100 of FIG. 1 in third alternate detail, is illustrative of such an example implementation.

More specifically, and with continued reference to FIGS. 1-6, FIG. 7 shows unit controller 104, of air cooling unit 102, which is configured to override a fan speed set-point that is programmed to air cooling unit 102 by system controller 106 via network 154 based upon an air pressure and/or temperature reading taken by a sensor 108 positioned within data center 100. By doing so, unit controller 104 may limit power draw by air cooling unit 102 from electric bus 124, that in turn is coupled to power supply 126, to within a bounded range of values that is defined by a power draw set-point of air cooling unit 102. In an example, the power draw set-point is programmed to air cooling unit 102 by system controller 106 via network 154 based upon a number of instances of air cooling unit 102 that is/are coupled to electrical bus 124 to at all times prevent electric bus 124 from overload or oversubscription. Further, system controller 106 may be configured to one of enable and disable air cooling unit 102 to adjust the fan speed set-point of AMC 146, which is equivalent to system controller 106 being capable of enabling (activating) and disabling (deactivating) unit controller 104 to implement aspects of the present disclosure as discussed throughout. Network 154 may include a private network associated with data center 100.

Although illustrated as a single entity, network 154 may comprise a combination of networks, wireless and/or hardwired (analog or digital) whereby implementation specific-details of network 154 may evolve as technology evolves. Furthermore, depending on implementation, digital signaling techniques, analog signaling techniques, or any combination thereof, may be used by components within or external to data center 100 for the purpose of overriding a programmed set-point of an air moving component of a cooling unit, in order to control an extent of a refrigeration load on an air cooling component of the cooling unit in accordance with the disclosure.

Figure 8:
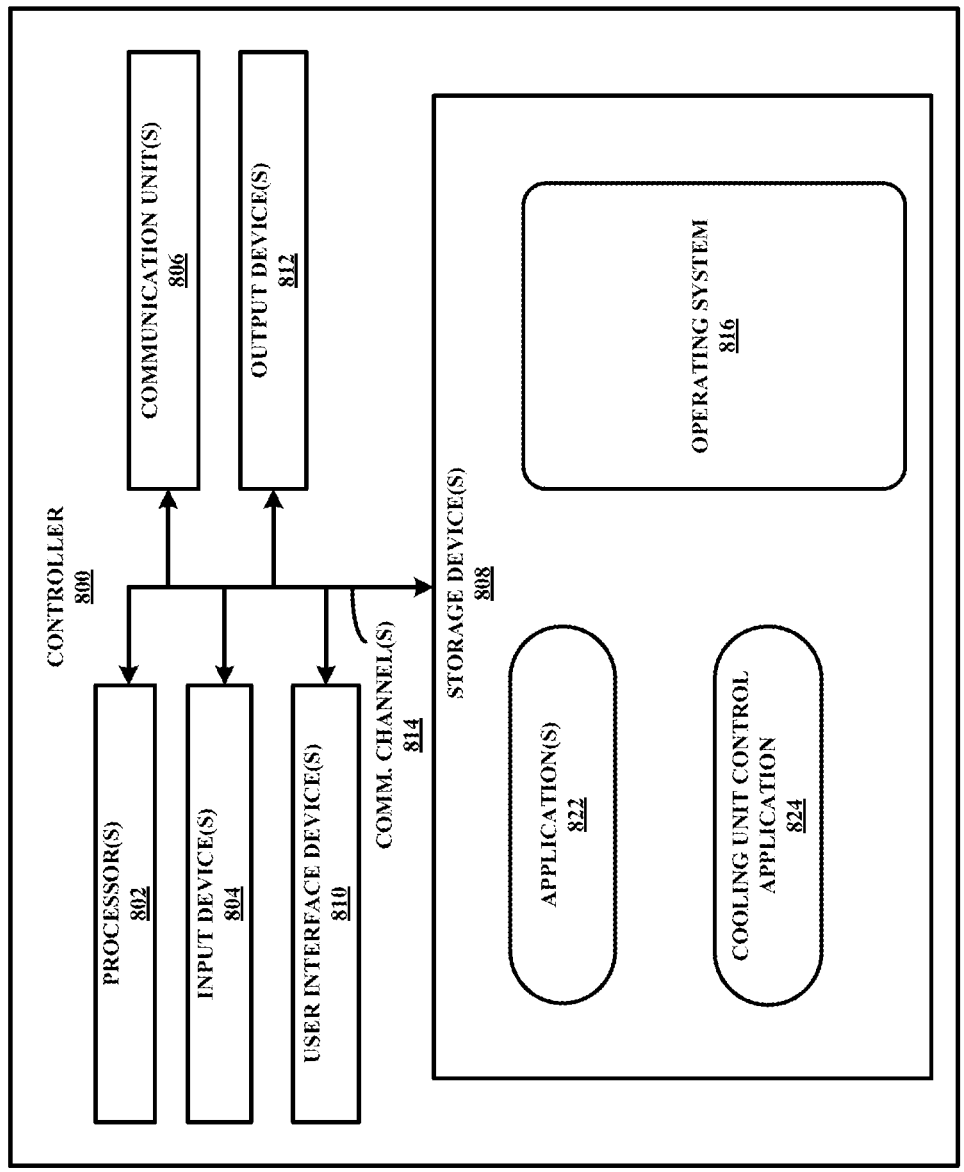
FIG. 8 shows an example controller according to the disclosure.

FIG. 8 shows an example controller 800 according to the disclosure. More specifically, FIG. 8 is a block diagram that illustrates, in further detail, an example of unit controller 104, a computing device, for controlling air cooling unit 102 of FIGS. 1-7, in accordance with one or more techniques of the disclosure. Furthermore, controller 800 may represent an example of system controller 106 of FIGS. 1-7, and controller 800 may include a server or other computing device that includes one or more processor(s) 802 for executing cooling unit control application 824. Other examples of controller 800 may be used in other instances. Although shown in FIG. 8 as a stand-alone controller 800 for purposes of example, a computing device may be any component or system that includes one or more processors or other suitable computing environment for executing software instructions and, for example, need not necessarily include one or more elements shown in FIG. 8 (e.g., communication units 806; and in some examples components such as storage device(s) 808 may not be co-located or in the same chassis as other components).

As shown in the specific example of FIG. 8, controller 800 includes one or more processors 802, one or more input devices 804, one or more communication units 806, one or more output devices 812, one or more storage devices 808, and user interface (UI) device 810, and communication unit 806. Controller 800, in one example, further includes one or more applications 822, cooling unit control applications 824, and operating system 816 that are executable by controller 800. Each of components 802, 804, 806, 808, 810, and 812 are coupled (physically, communicatively, and/or operatively) for inter-component communications. In some examples, communication channels 814 may include a system bus, a network connection, an inter-process communication data structure, or any other method for communicating data. Communication may be via one or more communication protocols including ModBus, BacNET, proprietary DDC or PLC manufacturer's protocol, or an open protocol. As one example, components 802, 804, 806, 808, 810 and 812 may be coupled by one or more communication channels 814. Controller 800 may be located and execute, for example, within data center 100 or at another location.

Processors 802, in one example, are configured to implement functionality and/or process instructions for execution within controller 800. For example, processors 802 may be capable of processing instructions stored in storage device 808. Examples of processors 802 may include, any one or more of a microprocessor, a controller, a digital signal processor (DSP), an application specific integrated circuit (ASIC), a field-programmable gate array (FPGA), or equivalent discrete or integrated logic circuitry.

One or more storage devices 808 may be configured to store information within controller 800 during operation. Storage device 808, in some examples, is described as a computer-readable storage medium. In some examples, storage device 808 is a temporary memory, meaning that a primary purpose of storage device 808 is not long-term storage. Storage device 808, in some examples, includes volatile memory, meaning that storage device 808 does not maintain stored contents when the computer is turned off. Examples of volatile memories include random access memories (RAM), dynamic random access memories (DRAM), static random access memories (SRAM), and other forms of volatile memories known in the art. In some examples, storage device 808 is used to store program instructions for execution by processors 802. Storage device 808 in one example, is used by software or applications running on controller 800 to temporarily store information during program execution.

Storage devices 808, in some examples, also include one or more computer-readable storage media. Storage devices 808 may be configured to store larger amounts of information than volatile memory. Storage devices 808 may further be configured for long-term storage of information. In some examples, storage devices 808 include non-volatile storage elements. Examples of such non-volatile storage elements include magnetic hard discs, optical discs, floppy disks, Flash memories, or forms of electrically programmable memories (EPROM) or electrically erasable and programmable (EEPROM) memories.

Controller 800, in some examples, also includes one or more communication units 806. Controller 800, in one example, utilizes communication units 806 to communicate with external devices via one or more networks, such as one or more wired/wireless/mobile networks, network 154, etc. Communication units 806 may include a network interface card, such as an Ethernet card, an optical transceiver, a radio frequency transceiver, or any other type of device that can send and receive information. Other examples of such network interfaces may include 3G and WiFi radios. In some examples, controller 800 may use communication unit 806 to communicate with an external device, such as system controller 106, sensor 108, servers 130, or any component within or external data center 100, whereby any of one or more of above-mentioned communication protocols may be used as examples for external communications. In some examples, communication unit(s) 806 and input device(s) 804 may be operatively coupled to controller 800. For example, controller 800 may receive a communication from an analog input device indicating an amperage, voltage, or other signal at the input device. Depending on implementation, digital signaling techniques, analog signaling techniques, or any combination thereof, may be used by controller 800 for the purpose of overriding a programmed set-point of an air moving component of a cooling unit, in order to control an extent of a refrigeration load on an air cooling component of the cooling unit in accordance with the disclosure.

Controller 800, in one example, also includes one or more user interface devices 810. User interface devices 810, in some examples, are configured to receive input from a user through tactile, audio, or video feedback. Examples of user interface devices(s) 810 include a presence-sensitive display, a mouse, a keyboard, a voice responsive system, video camera, microphone or any other type of device for detecting a command from a user. In some examples, a presence-sensitive display includes a touch-sensitive screen.

One or more output devices 812 may also be included in controller 800. Output device 812, in some examples, is configured to provide output to a user using tactile, audio, or video stimuli. Output device 812, in one example, includes a presence-sensitive display, a sound card, a video graphics adapter card, or any other type of device for converting a signal into an appropriate form understandable to humans or machines. Additional examples of output device 812 include a speaker, a cathode ray tube (CRT) monitor, a liquid crystal display (LCD), or any other type of device that can generate intelligible output to a user.

Controller 800 may include operating system 816. Operating system 816, in some examples, controls the operation of components of controller 800. For example, operating system 816, in one example, facilitates the communication of one or more applications 822 and cooling unit control applications 824 with processors 802, communication unit 806, storage device 808, input device 804, user interface devices 810, and output device 812.

Application 822 and cooling unit control applications 824 may also include program instructions and/or data that are executable by controller 800. Cooling unit control application 824 may include instructions for causing computing device to perform one or more of the operations and actions described in the present disclosure with respect to unit controller 104 of air cooling unit 102. As one example, cooling unit control application 824 may include instructions that cause the processor(s) 802 of unit controller 104 to supply air to ACC 148 at a volumetric flow rate that is defined by a fan speed set-point of AMC 146 as illustrated and/or described above in connection with at least FIG. 3. Further, cooling unit control application 824 may include instructions that cause the processor(s) 802 of unit controller 104 to adjust the fan speed set-point of AMC 146 to limit power draw by air cooling unit 102 from electrical bus 124 to within a bounded range of values that is defined by a power draw set-point of air cooling unit 102 as illustrated and/or described above in connection with at least FIG. 5. In these examples, ACC 148 comprises at least one cooling coil 152, and AMC 146 comprises at least one fan 150, where power consumption of ACC 148 is directly proportional and power consumption of AMC 146 is cube or cubic proportional ($\sim x^3$) to volumetric flow rate of air supplied by AMC 146 to ACC 148, as and/or and described above in connection with at least FIG. 4 whereby power consumption of ACC 148, as well as power consumption of AMC 146, increases with increasing fan speed of fan(s) 150 of AMC 146.

As another example, cooling unit control application 824 may include instructions that cause the processor(s) 802 of unit controller 104 to increase or decrease fan speed set-point of AMC 146 from an instant set-point value to a set-point value that is greater than or less than the instant set-point value to increase or decrease power draw by air cooling unit 102 from electrical bus 124, as illustrated and/or described above in connection with at least FIGS. 4-5. As another example, cooling unit control application 824 may include instructions that cause the processor(s) 802 of unit controller 104 to adjust fan speed set-point of AMC 146 to an initial fan speed set-point to supply air to ACC 148 at a volumetric flow rate that is defined by the initial fan speed set-point based upon a signal received via a communication unit from system controller 106, as illustrated and/or described above in connection with at least FIGS. 6-7.

As another example, cooling unit control application 824 may include instructions that cause the processor(s) 802 of unit controller 104 to adjust fan speed set-point to limit power draw by air cooling unit 102 from electrical bus 124 to within a bounded range of values based on a power draw set-point as received via a communication unit or by hardwired analog connection from system controller 106, as illustrated and/or described above in connection with at least FIGS. 6-7. More specifically, in some examples, and as would be understood by one of skill, communication unit 806 may include or comprise one or more hardware input/output ports that in turn is/are coupled to a wire or line such that communication unit 806 may receive analog signals, such as analog signals that indicate or represent one or more set-points as discussed throughout the present disclosure. As another example, cooling unit control application 824 may include instructions that cause the processor(s) 802 of unit controller 104 to one of enable and disable air cooling unit 102 to adjust the fan speed set-point of AMC, as illustrated and/or described above in connection with at least FIG. 7. As another example, cooling unit control application 824 may include instructions that cause the processor(s) 802 of unit controller 104 to obtain a reading from power meter 144, and based on the reading limit power draw by air cooling unit 102 from electrical bus 124 to within the bounded range of values, as illustrated and/or described above in connection with at least FIG. 3.

As another example, cooling unit control application 824 may include instructions that cause the processor(s) 802 of unit controller 104 to execute an algorithm for limiting power draw from electrical bus 124 by air cooling unit 102 to within a bounded range of values by controlling a fan speed set-point of AMC 146, which is configured to supply air to ACC 148 at a volumetric flow rate that is defined by the fan speed set-point as illustrated and/or described above in connection with at least FIG. 1. As another example, cooling unit control application 824 may include instructions that cause the processor(s) 802 of unit controller 104 to execute an algorithm for activating or deactivating air cooling unit 102 to limit power draw from electrical bus 124 as illustrated and/or described above in connection with at least FIG. 7.

As another example, cooling unit control application 824 may include instructions that cause the processor(s) 802 of unit controller 104 to execute an algorithm for detecting that power draw from electrical bus 124 is increasing to an upper bound of the bounded range of values at a particular rate or decreasing to a lower bound of the bounded range of values at a particular rate and, in response to the detecting, decreasing or increasing the fan speed set-point of the air moving component from an instant set-point value to a set-point value that is less than or greater than the instant set-point value to decrease or increase power draw from electrical bus 124 by air cooling unit 102, as illustrated and/or described above in connection with at least FIG. 5.

As another example, cooling unit control application 824 may include instructions that cause the processor(s) 802 of unit controller 104 to execute an algorithm for, in response to receiving a signal that represents a minimum volumetric flow rate, controlling the fan speed set-point of AMC 146 to supply air to ACC 148 at a volumetric flow rate that is greater than or equal to the minimum volumetric flow rate, as illustrated and/or described above in connection with at least FIG. 6. As another example, cooling unit control application 824 may include instructions that cause the processor(s) 802 of unit controller 104 to execute an algorithm for adjusting fan speed set-point of AMC 146 from an initial fan speed set-point to a set-point that is different than the initial fan speed set-point, transmitting a signal that is representative of operational status of air cooling unit 102 to system controller 106 that is configured to monitor each one of a plurality of air cooling units 102A-C coupled to electrical bus 124, as illustrated and/or described above in connection with at least FIG. 6.

The techniques described herein may be implemented in hardware, software, firmware, or any combination thereof. Various features described as modules, units or components may be implemented together in an integrated logic device or separately as discrete but interoperable logic devices or other hardware devices. In some cases, various features of electronic circuitry may be implemented as one or more integrated circuit devices, such as an integrated circuit chip or chipset.

If implemented in hardware, this disclosure may be directed to an apparatus such as a processor or an integrated circuit device, such as an integrated circuit chip or chipset. Alternatively or additionally, if implemented in software or firmware, the techniques may be realized at least in part by a computer-readable data storage medium comprising instructions that, when executed, cause a processor to perform one or more of the methods described above. For example, the computer-readable data storage medium may store such instructions for execution by a processor.

A computer-readable medium may form part of a computer program product, which may include packaging materials. A computer-readable medium may comprise a computer data storage medium such as random access memory (RAM), read-only memory (ROM), non-volatile random access memory (NVRAM), electrically erasable programmable read-only memory (EEPROM), Flash memory, magnetic or optical data storage media, and the like. In some examples, an article of manufacture may comprise one or more computer-readable storage media.

In some examples, the computer-readable storage media may comprise non-transitory media. The term "non-transitory" may indicate that the storage medium is not embodied in a carrier wave or a propagated signal. In certain examples, a non-transitory storage medium may store data that can, over time, change (e.g., in RAM or cache).

The code or instructions may be software and/or firmware executed by processing circuitry including one or more processors, such as one or more digital signal processors (DSPs), general purpose microprocessors, application-specific integrated circuits (ASICs), field-programmable gate arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, functionality described in this disclosure may be provided within software modules or hardware modules.

Various embodiments have been described. These and other embodiments are within the scope of the following examples.

What is claimed is:

1. An air cooling unit that is configured to be coupled to an electrical bus, comprising:
   an air cooling component;
   an air moving component that is configured to supply air to the air cooling component at a volumetric flow rate according to a fan speed set-point of the air moving component; and
   a unit controller that is configured to adjust the fan speed set-point of the air moving component from a programmed fan speed set-point to limit power draw by the air cooling unit from the electrical bus to within a bounded range of values that is defined in part by a power draw set-point of the air cooling unit, wherein the programmed fan speed set-point is received by the unit controller from a unit external to the unit controller.

2. The air cooling unit of claim 1, wherein the air cooling component comprises at least one cooling coil, and wherein power consumption of the air cooling component is proportional to volumetric flow rate of air supplied by the air moving component to the air cooling component.

3. The air cooling unit of claim 1, wherein the air moving component comprises at least one fan, and wherein power consumption of the air moving component is cube or cubic proportional to volumetric flow rate of air supplied by the air moving component to the air cooling component.

4. The air cooling unit of claim 1, wherein the unit controller is configured to increase the fan speed set-point of the air moving component from an instant set-point value to a set-point value that is greater than the instant set-point value to increase power draw by the air cooling unit from the electrical bus.

5. The air cooling unit of claim 1, wherein the unit controller is configured to decrease the fan speed set-point of the air moving component from an instant set-point value to a set-point value that is less than the instant set-point value to decrease power draw by the air cooling unit from the electrical bus.

6. The air cooling unit of claim 1, further comprising a communication unit, wherein the air cooling unit is configured to receive a signal, via the communication unit, that is representative of an initial fan speed set-point, and to adjust the fan speed set-point to the initial fan speed set-point to supply air to the air cooling component at a volumetric flow rate that is defined by the initial fan speed set-point.

7. The air cooling unit of claim 1, further comprising a communication unit, wherein the air cooling unit is configured to receive a signal, via the communication unit, that is representative of the power draw set-point and, based on the power draw set-point, to adjust the fan speed set-point to limit power draw by the air cooling unit from the electrical bus to within the bounded range of values.

8. The air cooling unit of claim 1, further comprising a communication unit, wherein the air cooling unit is configured to receive a signal, via communication interface, to one of enable and disable the air cooling unit to adjust the fan speed set-point of the air moving component.

9. The air cooling unit of claim 1, wherein the power draw set-point is less than an upper bound value of the bounded range of values and greater than a lower bound value of the bounded range of values.

10. The air cooling unit of claim 1, further comprising a power meter, wherein the power meter is configured to generate a signal that is representative of instantaneous power draw by the air cooling unit from the electrical bus to enable the air cooling unit to limit power draw by the air cooling unit from the electrical bus to within the bounded range of values.

11. A method comprising:
    by an air cooling unit that includes a unit controller, an air moving component and an air cooling component and that is coupled to an electrical bus, receiving, by the unit controller from a unit external to the unit controller, a programmed fan speed set-point for the air moving component, and
    limiting power draw from the electrical bus by the air cooling unit to within a bounded range of values by adjusting a fan speed set-point of the air moving component from the programmed fan speed set-point, wherein the air moving component is configured to supply air to the air cooling component at a volumetric flow rate that is defined by the fan speed set-point.

12. The method of claim 11, further comprising receiving a signal to one of activate and deactivate the air cooling unit to limit power draw from the electrical bus.

13. The method of claim 11, further comprising:
- detecting that power draw from the electrical bus is increasing to an upper bound of the bounded range of values at a particular rate; and
- in response to the detecting, decreasing the fan speed set-point of the air moving component from an instant set-point value to a set-point value that is less than the instant set-point value to decrease power draw from the electrical bus by the air cooling unit.

14. The method of claim 11, further comprising:
- detecting that power draw from the electrical bus is decreasing to a lower bound of the bounded range of values at a particular rate; and
- in response to the detecting, increasing the fan speed set-point of the air moving component from an instant set-point value to a set-point value that is greater than the instant set-point value to increase power draw from the electrical bus by the air cooling unit.

15. The method of claim 11, further comprising:
- receiving a signal that represents a minimum volumetric flow rate; and
- in response to the receiving, controlling the fan speed set-point of the air moving equipment to supply air to the air cooling component at a volumetric flow rate that is greater than or equal to the minimum volumetric flow rate.

16. The method of claim 11, further comprising:
- adjusting the fan speed set-point of the air moving component from an initial fan speed set-point to a set-point that is different than the initial fan speed set-point; and
- transmitting a signal that is representative of operational status of the air cooling unit to a system controller that is configured to monitor each one of a plurality of air cooling units coupled to the electrical bus.

17. A system comprising:
- at least one air cooling unit that is coupled to an electrical bus of a data center and that comprises a unit controller, an air cooling component and an air moving component that is configured to supply air to the air cooling component at a volumetric flow rate that is defined by a fan speed set-point of the air moving component, wherein the unit controller is configured to adjust the fan speed set-point of the air moving component; and
- a system controller external to the unit controller that is configured to manage operational status of the at least one air cooling unit,
- wherein the unit controller is configured to adjust the fan speed set-point of the air moving component from a programmed fan speed set-point to limit power draw from the electrical bus by the at least one air cooling unit to within a bounded range of values that is defined by a power draw set-point determined by the system controller, wherein the programmed fan speed set-point is received by the unit controller from the system controller.

18. The system of claim 17, further comprising at least one sensor, and wherein the system controller is configured to determine the fan speed set-point from at least one of a pressure and temperature reading obtained from the at least one sensor, and to program the at least air cooling unit to supply air from the air moving component to the air cooling component according to the fan speed set-point.

19. The system of claim 17, wherein the system controller is configured to determine the fan speed set-point from at least one of a pressure and temperature reading at a location within the data center, and to program the at least air cooling unit to supply air from the air moving component to the air cooling component according to the fan speed set-point.

20. The system of claim 17, wherein the system controller is configured to determine the power draw set-point based on a number of air cooling units coupled to the electrical bus, and to program the at least air cooling unit to adjust the fan speed set-point according to the power draw set-point.

* * * * *